United States Patent
Tsai et al.

(10) Patent No.: US 7,659,557 B2
(45) Date of Patent: Feb. 9, 2010

(54) SEMICONDUCTOR LIGHT-EMITTING DEVICE AND METHOD OF FABRICATING THE SAME

(75) Inventors: Chiung-Chi Tsai, Tanzih Township, Taichung Country (TW); Tzong-Liang Tsai, Hsinchu (TW); Yu-Chu Li, Taichung (TW)

(73) Assignee: Huga Optotech Inc., Taichung (TW)

( * ) Notice: Subject to any disclaimer, the term of this patent is extended or adjusted under 35 U.S.C. 154(b) by 1 day.

(21) Appl. No.: 11/798,873

(22) Filed: May 17, 2007

(65) Prior Publication Data
US 2008/0023709 A1 Jan. 31, 2008

(30) Foreign Application Priority Data
Jul. 28, 2006 (TW) .............................. 95127869 A

(51) Int. Cl.
*H01L 33/00* (2006.01)
(52) U.S. Cl. .................. 257/103; 257/79; 257/E33.037
(58) Field of Classification Search .................. 257/79, 257/103, E33.037
See application file for complete search history.

(56) References Cited

U.S. PATENT DOCUMENTS

| 6,377,598 B1 * | 4/2002 | Watanabe et al. ........ 372/46.01 |
| 7,087,924 B2 * | 8/2006 | Wu et al. ...................... 257/22 |
| 2004/0079947 A1 * | 4/2004 | Lan et al. ....................... 257/79 |

* cited by examiner

*Primary Examiner*—Davienne Monbleau
*Assistant Examiner*—Eduardo A Rodela
(74) *Attorney, Agent, or Firm*—Birch, Stewart, Kolasch & Birch, LLP

(57) ABSTRACT

The invention provides a semiconductor light-emitting device with II-V group (or II-IV-V group) compound contact layer and a method of fabricating the same. The semiconductor light-emitting device according to a preferred embodiment of the invention includes a substrate, a first conductive type semiconductor material layer, a light-emitting layer, a first electrode, a second conductive type semiconductor material layer, a II-V group (or II-IV-V group) compound contact layer, a transparent conductive layer, and a second electrode. The existence of the II-V group (or II-IV-V group) compound contact layer improves the ohmic contact between the second conductive type semiconductor material layer and the transparent conductive layer.

9 Claims, 6 Drawing Sheets

SEMICONDUCTOR LIGHT-EMITTING DEVICE AND METHOD OF FABRICATING THE SAME

BACKGROUND OF THE INVENTION

1. Field of the Invention

The invention relates to a semiconductor light-emitting device, and more particularly, to one with II-V group (or II-IV-V group) compound contact layer. With respect to the technology background of the invention, please refer to the following references:

[1] K. Kuriyama, Yukimi Takahashi, F. Sunohara. Optical band gap of $Zn_3N_2$ films. *PHYSICAL REVIEW B* 1993;48(4):2781-2782;

[2] B. Chelluri, T. Y. Chang, A. Ourmazd, A. H. Dayem, J. L. Zyskind, A. Srivastava. Molecular beam epitaxial growth of the II-V semiconductor compound $Zn_3As_2$. *Appl. Phys. Lett.* 1986;49(24):1665-1667;

[3] M. Sieberer, J. Redinger, S. Khmelevskyi, P. Mohn. Ferromagnetism in tetrahedrally coordinated compounds of I/II-V elements: Ab initio calculations. *PHYSICAL REVIEW B* 2006,73(024404):1-9; and

[4] C M Fang, R A de Groot, R J Bruls, H T Hintzen, G de With. Ab initio band structure calculations of $Mg_3N_2$ and $MgSiN_2$. *J. Phys.* 1999;*Condens. Matter* 11:4833-4842.

2. Description of the Prior Art

Light-emitting diodes can be applied to various kinds of equipments, such as optical display equipments, regulatory signs, telecommunication equipments, and illuminating equipments. Light-emitting diodes, distinct from the conventional light sources, are applicable to different industries.

Compared to the tungsten lamps of prior art, light-emitting diodes consume less electricity and respond more quickly. Furthermore, light-emitting diodes have better illuminating efficiency, longer life time, and smaller size; they also consume less power and do not have hazardous substances like mercury.

The radiating principle of the light-emitting diodes is that the bonding of electrons and holes in the light-emitting layer of P-type and N-type semiconductors forms photons to generate light on forward bias. Because the P-type GaN semiconductor is hard to be doped, the contact of P-type GaN semiconductor and conductive layer produces higher resistance and consequently decreases the efficiency of P-type GaN semiconductor.

Taiwanese Patent No. 459,407 provides a proposal to reduce the contact resistance between a P-type GaN semiconductor layer and a conductive layer. Referring to FIG. 1, FIG. 1 illustrates a light-emitting diode structure having an n+ type reverse tunneling layer. The light-emitting diode structure includes an insulated sapphire substrate 11, a GaN buffer layer 12, an N-type GaN contact layer 13, an N-type AlGaN constraint layer 14, an InGaN light-emitting layer 15, a P-type AlGaN constraint layer 16, a P-type GaN contact layer 17, an n+ type reverse tunneling layer 18, a transparent conductive layer 19, a first electrode 21, and a second electrode 22.

The GaN buffer layer 12 is formed on the insulated sapphire substrate 11. An N-type GaN contact layer 13 is formed on the GaN buffer layer 12 such that a partial area of the N-type GaN contact layer 13 is exposed. The first electrode 21 is formed on the exposed partial area of the N-type GaN contact layer 13. The N-type AlGaN constraint layer 14 is formed on the N-type GaN contact layer 13. The InGaN light-emitting layer 15 is formed on the N-type AlGaN constraint layer 14. The P-type AlGaN constraint layer 16 is formed on the InGaN light-emitting layer 15. The P-type GaN contact layer 17 is formed on the P-type AlGaN constraint layer 16. The n+ type reverse tunneling layer 18 is formed on the P-type GaN contact layer 17. The transparent conductive layer 19 is formed on the n+ type reverse tunneling layer 18 such that a partial area of the n+type reverse tunneling layer 18 is exposed. The second electrode 22 is formed on the exposed partial area of the n+ type reverse tunneling layer 18 and contacts the transparent conductive layer 19.

The light-emitting diode improves the ohmic contact between the P-type GaN contact layer 17 and the transparent conductive layer 19 by adding an n+ type reverse tunneling layer 18 between them.

However, due to a complex manufacturing process and difficult control of the n+type reverse tunneling layer 18, the finished products of light-emitting diodes are not stable and have a higher production cost as well.

Accordingly, a scope of the invention is to provide a semiconductor light-emitting device with II-V group (or II-IV-V group) compound contact layer, capable of improving the ohmic contact between the P-type GaN contact layer and the transparent conductive layer. Moreover, the semiconductor light-emitting device with II-V group (or II-IV-V group) compound contact layer has an easier manufacturing process; it also increases the stability for production and consequently has a lower production cost.

SUMMARY OF THE INVENTION

A scope of the invention is to provide a semiconductor light-emitting device, with II-V group (or II-IV-V group) compound contact layer, capable of improving the ohmic contact between the P-type GaN contact layer and the transparent conductive layer.

A semiconductor light-emitting device according to a preferred embodiment of the invention includes a substrate, a first conductive type semiconductor material layer, a light-emitting layer, a first electrode, a second conductive type semiconductor material layer, a II-V group compound contact layer, a transparent conductive layer, and a second electrode. The first conductive type semiconductor material layer is formed on the substrate. The light-emitting layer is formed on the first conductive type semiconductor material layer such that a partial area of the first conductive type semiconductor material layer is exposed. The first electrode is formed on the exposed partial area of the first conductive type semiconductor material layer. The second conductive type semiconductor material layer is formed on the light-emitting layer. The II-V group compound contact layer is formed on the second conductive type semiconductor material layer. The transparent conductive layer is formed on the II-V group compound contact layer such that a partial area of the II-V group compound contact layer is exposed. The second electrode is formed on the exposed partial area of the II-V group compound contact layer and contacts the transparent conductive layer.

A semiconductor light-emitting device according to another preferred embodiment of the invention is substantially the same as mentioned above, where the only difference is the II-V group compound contact layer is substituted by a II-IV-V group compound contact layer.

According to a preferred embodiment of the invention, a method of making a semiconductor light-emitting device is provided. First, the method according to the invention prepares a substrate. Then, the method forms a first conductive type semiconductor material layer on the substrate. Next, the method forms a light-emitting layer on the first conductive type semiconductor material layer. Next, the method forms a second conductive type semiconductor material layer on the light-emitting layer. Next, the method forms a II-V group compound contact layer on the second conductive type semiconductor material layer. Next, the method partially removes the II-V group compound contact layer, the second conductive type semiconductor material layer, the light-emitting layer, and the first conductive type semiconductor material layer such that a partial area of the first conductive type semiconductor material layer is exposed. Then, the method forms a first electrode on the exposed partial area of the first conductive type semiconductor material layer. Next, the method forms a transparent conductive layer on the II-V group compound contact layer. Then, the method partially removes the transparent conductive layer such that a partial area of the II-V group compound contact layer is exposed. Finally, the method forms a second electrode on the exposed partial area of the II-V group compound contact layer such that the second electrode contacts the transparent conductive layer.

A method according to another preferred embodiment of the invention is substantially the same as mentioned above, where the only difference is the II-V group compound contact layer is substituted by a II-IV-V group compound contact layer.

The advantage and spirit of the invention may be understood by the following recitations together with the appended drawings.

BRIEF DESCRIPTION OF THE APPENDED DRAWINGS

DETAILED DESCRIPTION OF THE INVENTION

Referring to FIGS. 2A through 2G, FIGS. 2A through 2G are the schematic sectional views illustrating a method of making a semiconductor light-emitting device according to a preferred embodiment of the invention.

Figure 1:
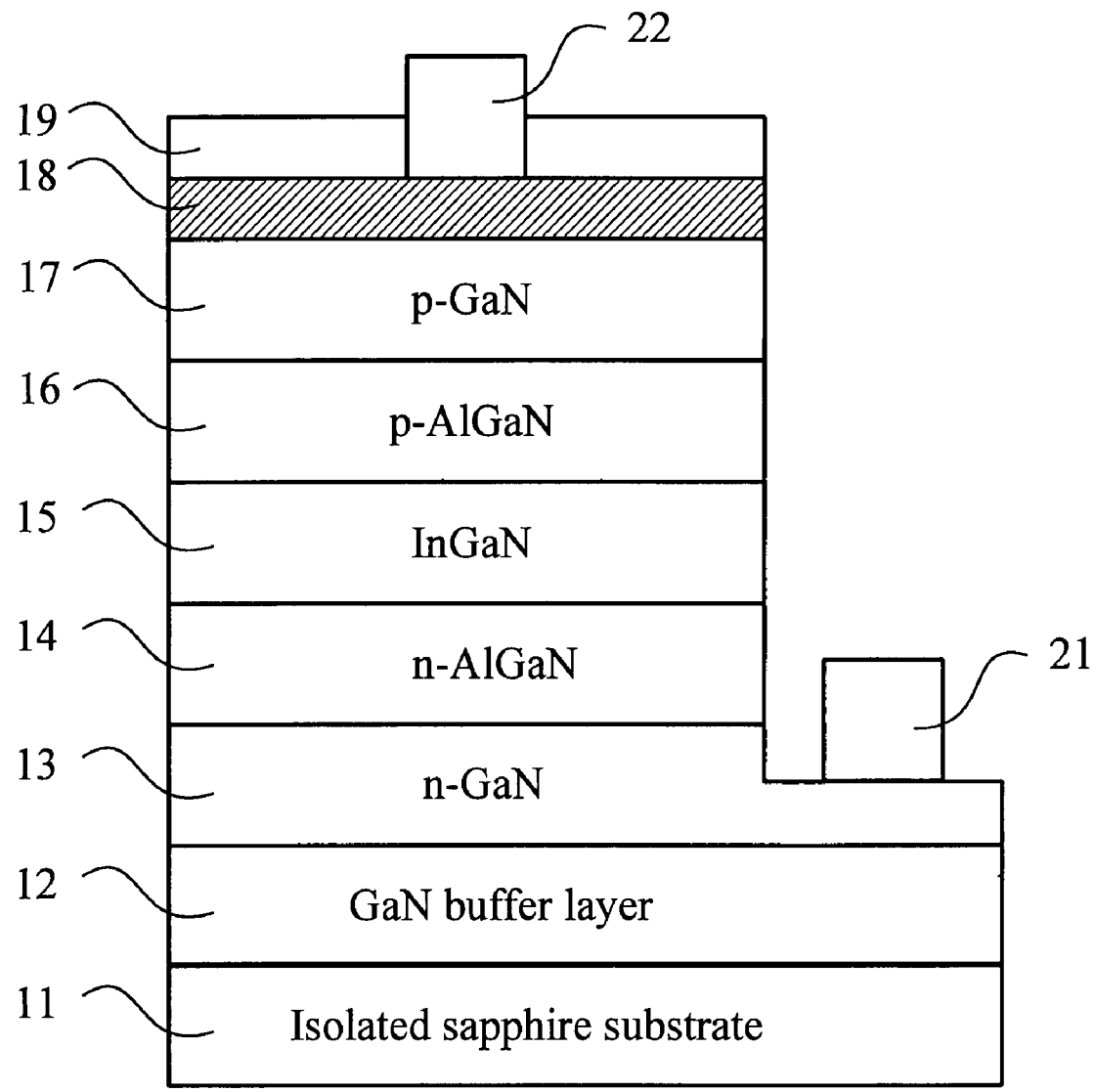
FIG. 1 is the schematic sectional view of a light-emitting diode device with n+type reverse tunneling layer.
Figure 2A:
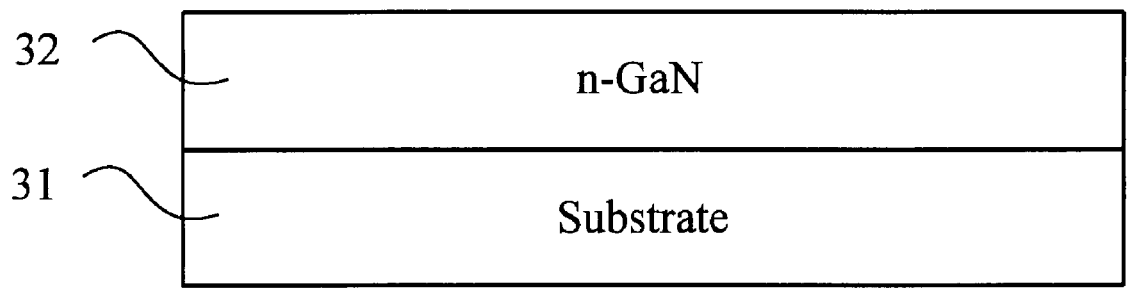
FIGS. 2A through 2G are the schematic sectional views illustrating a method of making a semiconductor light-emitting device with a II-V group compound contact layer according to a preferred embodiment of the invention.

First, referring to FIG. 2A, the method according to the preferred embodiment of the invention prepares a substrate 31 and forms a first conductive type semiconductor material layer 32 on the substrate 31.

In one embodiment, the material of the substrate 31 can be Si, GaN, AlN, sapphire, spinnel, SiC, GaAs, $Al_2O_3$, $LiGaO_2$, $LiAlO_2$, or $MgAl_2O_4$.

In one embodiment, the first conductive type semiconductor material layer 32 can be formed of a GaN material, and the first conductive type can be N-type.

Figure 2B:
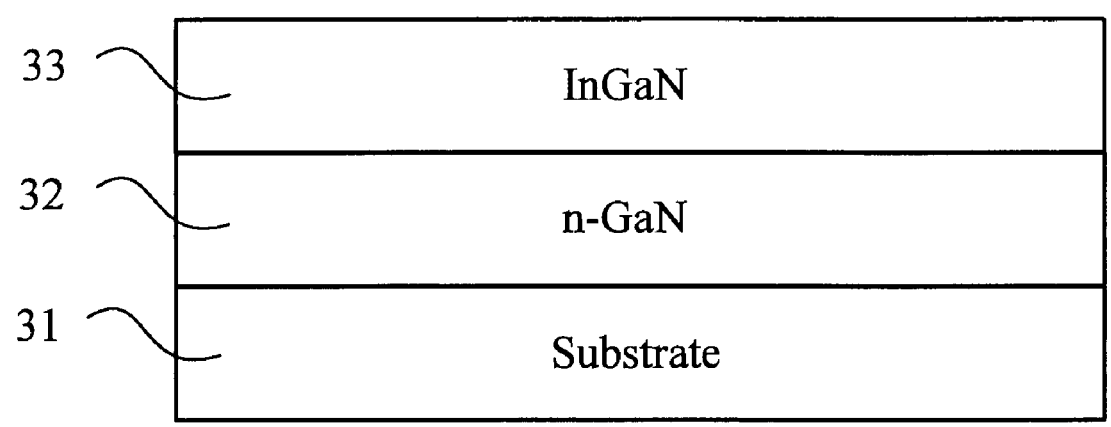

Next, referring to FIG. 2B, the method forms a light-emitting layer 33 on the first conductive type semiconductor material layer 32.

In one embodiment, the material of the light-emitting layer 33 can be InGaN, AlGaN, or InGaAs.

Figure 2C:
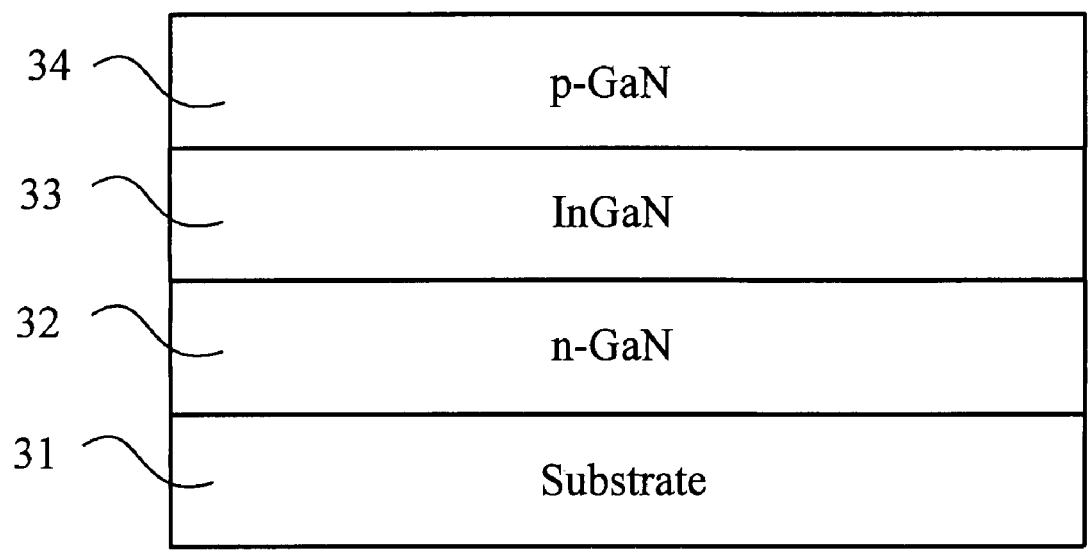

Next, referring to FIG. 2C, the method forms a second conductive type semiconductor material layer 34 on the light-emitting layer 33.

In one embodiment, the second conductive type semiconductor material layer 34 can be formed of a GaN material, and the second conductive type can be P-type.

Figure 2D:
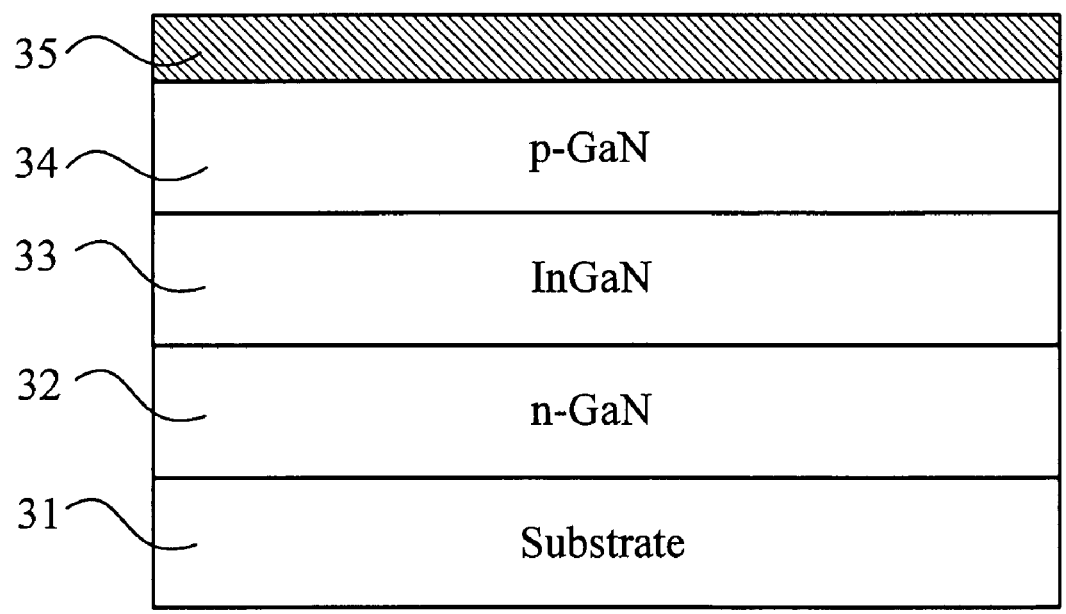

Next, referring to FIG. 2D, the method forms a II-V group compound contact layer 35 on the second conductive type semiconductor material layer 34.

In one embodiment, the II-V group compound contact layer 35 can be represented by the general formula: $M_xN_y$, where M represents the II group chemical element, N represents the V group chemical element, $1 \leq x \leq 3$, and $1 \leq y \leq 3$; x and y are molar numbers.

In one embodiment, a II group chemical element in the II-V group compound contact layer 35 can be Zn, Be, Mg, Ca, Sr, Ba, or Ra. Furthermore, a V group chemical element in the II-V group compound contact layer 35 can be N, P, As, Sb, or Bi.

In one embodiment, the thickness of the II-V group compound contact layer 35 can range from 0.5 Angstroms to 500 Angstroms.

In one embodiment, the II-V group compound contact layer 35 can be formed at a temperature ranging from 400° C. to 1100° C.

Figure 2E:
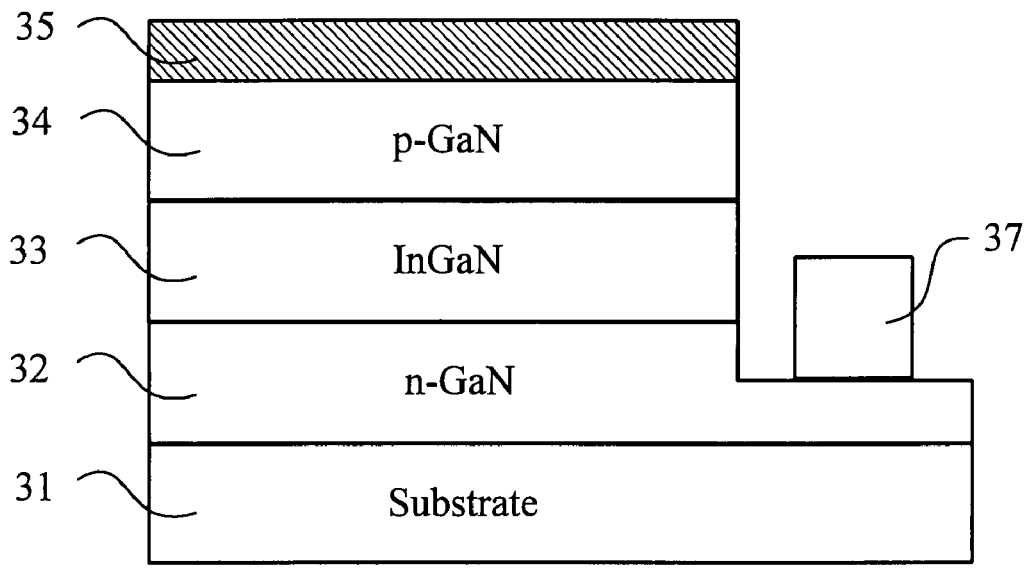

Next, referring to FIG. 2E, the method partially removes the II-V group compound contact layer 35, the second conductive type semiconductor material layer 34, the light-emitting layer 33, and the first conductive type semiconductor material layer 32 such that a partial area of the first conductive type semiconductor material layer 32 is exposed. Then, the method forms a first electrode 37 on the exposed partial area of the first conductive type semiconductor material layer 32.

Figure 2F:
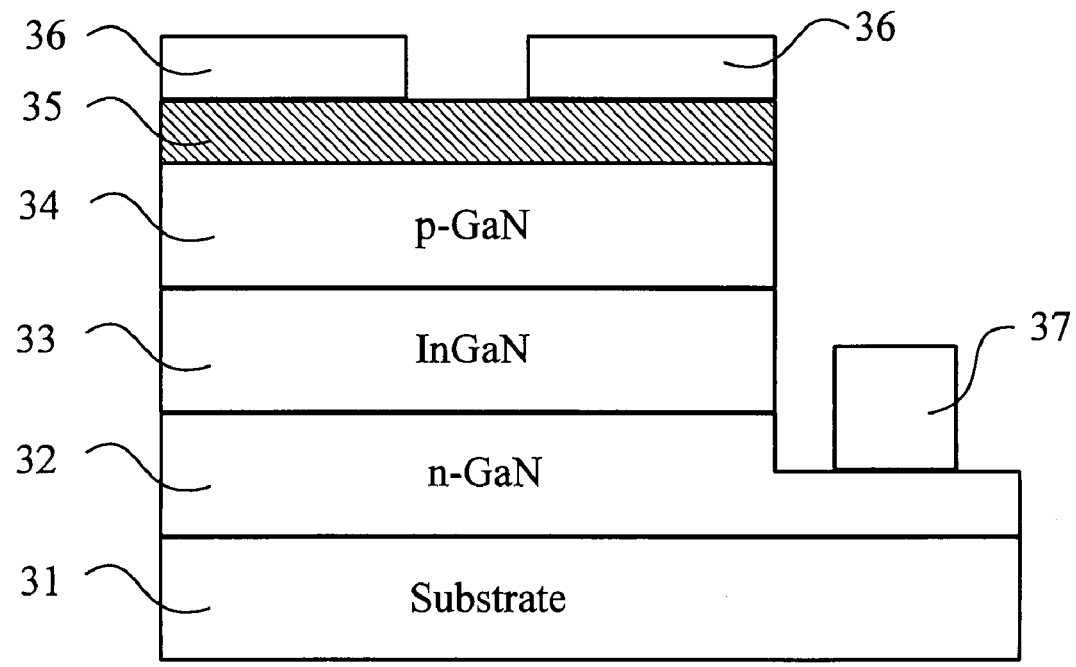

Next, referring to FIG. 2F, the method forms a transparent conductive layer 36 on the II-V group compound contact layer 35. Then, the method partially removes the transparent conductive layer 36 such that a partial area of the II-V group compound contact layer 35 is exposed.

In one embodiment, the material of the transparent conductive layer 36 can be Ni/Au, ITO, CTO, TiWN, $In_2O_3$, $SnO_2$, CdO, ZnO, $CuGaO_2$, or $SrCu_2O_2$.

Figure 2G:
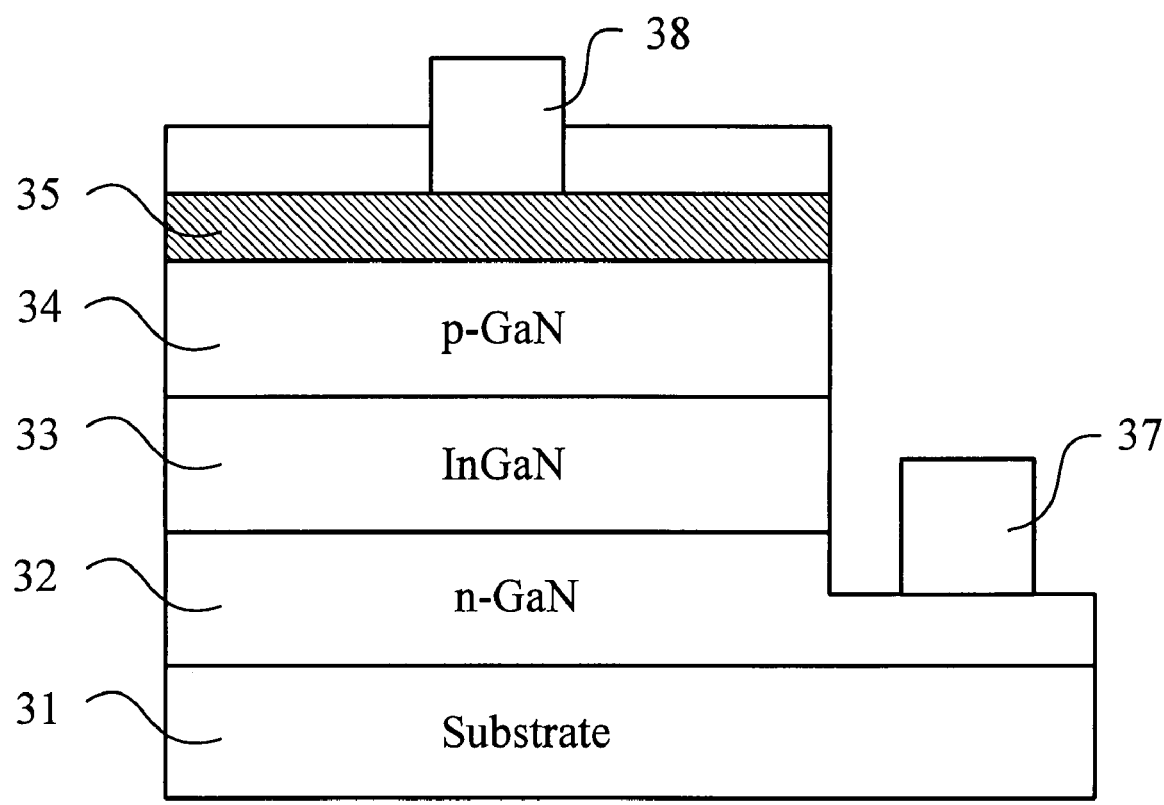

Finally, referring to FIG. 2G, the method forms a second electrode 38 on the exposed partial area of the II-V group compound contact layer 35 such that the second electrode contacts the transparent conductive layer 36.

A method according to another preferred embodiment of the invention is substantially the same as mentioned above, where the only difference is the II-V group compound contact layer 35 is substituted by a II-IV-V group compound contact layer. For example, the material of the II-IV-V group compound contact layer can be $MgSiN_2$.

Again, referring to FIG. 2G, FIG. 2G is the cross section view of the semiconductor light-emitting device according to a preferred embodiment of the invention.

The semiconductor light-emitting device according to the preferred embodiment of the invention includes a substrate 31, a first conductive type semiconductor material layer 32, a light-emitting layer 33, a first electrode 37, a second conductive type semiconductor material layer 34, a II-V group compound contact layer 35, a transparent conductive layer 36, and a second electrode 38.

The first conductive type semiconductor material layer 32 is formed on the substrate 31.

In one embodiment, the material of the substrate 31 can be Si, GaN, AlN, sapphire, spinnel, SiC, GaAs, $Al_2O_3$, $LiGaO_2$, $LiAlO_2$, or $MgAl_2O_4$.

In one embodiment, the first conductive type semiconductor material layer 32 can be formed of a GaN material, and the first conductive type can be N-type.

The light-emitting layer 33 is formed on the first conductive type semiconductor material layer 32 such that a partial area of the first conductive type semiconductor material layer 32 is exposed.

In one embodiment, the material of the light-emitting layer 33 can be InGaN, AlGaN, or InGaAs.

The first electrode 37 is formed on the exposed partial area of the first conductive type semiconductor material layer 32.

The second conductive type semiconductor material layer 34 is formed on the light-emitting layer 33.

In one embodiment, the second conductive type semiconductor material layer 34 can be formed of a GaN material, and the second conductive type can be P-type.

The II-V group compound contact layer 35 is formed on the second conductive type semiconductor material layer 34.

In one embodiment, the II-V group compound contact layer 35 can be represented by the general formula: $M_xN_y$, where M represents the II group chemical element, N represents the V group chemical element, $1 \leq x \leq 3$, and $1 \leq y \leq 3$; x and y are molar numbers.

In one embodiment, a II group chemical element in the II-V group compound contact layer 35 can be Zn, Be, Mg, Ca, Sr, Ba, or Ra. Furthermore, a V group chemical element in the II-V group compound contact layer 35 can be N, P, As, Sb, or Bi.

In one embodiment, the thickness of the II-V group compound contact layer 35 can range from 0.5 Angstroms to 500 Angstroms.

In one embodiment, the II-V group compound contact layer 35 can be formed at a temperature ranging from 400° C. to 1100° C.

The transparent conductive layer 36 is formed on the II-V group compound contact layer 35 such that a partial area of the II-V group compound contact layer 35 is exposed.

In one embodiment, the material of the transparent conductive layer 36 can be Ni/Au, ITO, CTO, TiWN, $In_2O_3$, $SnO_2$, CdO, ZnO, $CuGaO_2$, or $SrCu_2O_2$.

The second electrode 38 is formed on the exposed partial area of the II-V group compound contact layer 35 such that the second electrode contacts the transparent conductive layer 36.

A semiconductor light-emitting device according to another preferred embodiment of the invention is substantially the same as mentioned above, where the only difference is the II-V group compound contact layer 35 is substituted by a II-IV-V group compound contact layer. For example, the material of the II-IV-V group compound contact layer can be $MgSiN_2$.

The experimental result, according to "Ab initio band structure calculations of $Mg_3N_2$ and $MgSiN_2$," of Condens. Matter 11, J. Phys (1999), proves that the energy gap of $Mg_3N_2$ is about 2.8 eV, while that of $MgSiN_2$ is about 4.8 eV. Because the energy gap width of $Mg_3N_2$ and $MgSiN_2$ is similar to that of InGaN, it is helpful to decrease the resistance value between the P-type GaN contact layer and the transparent conductive layer.

Figure 3:
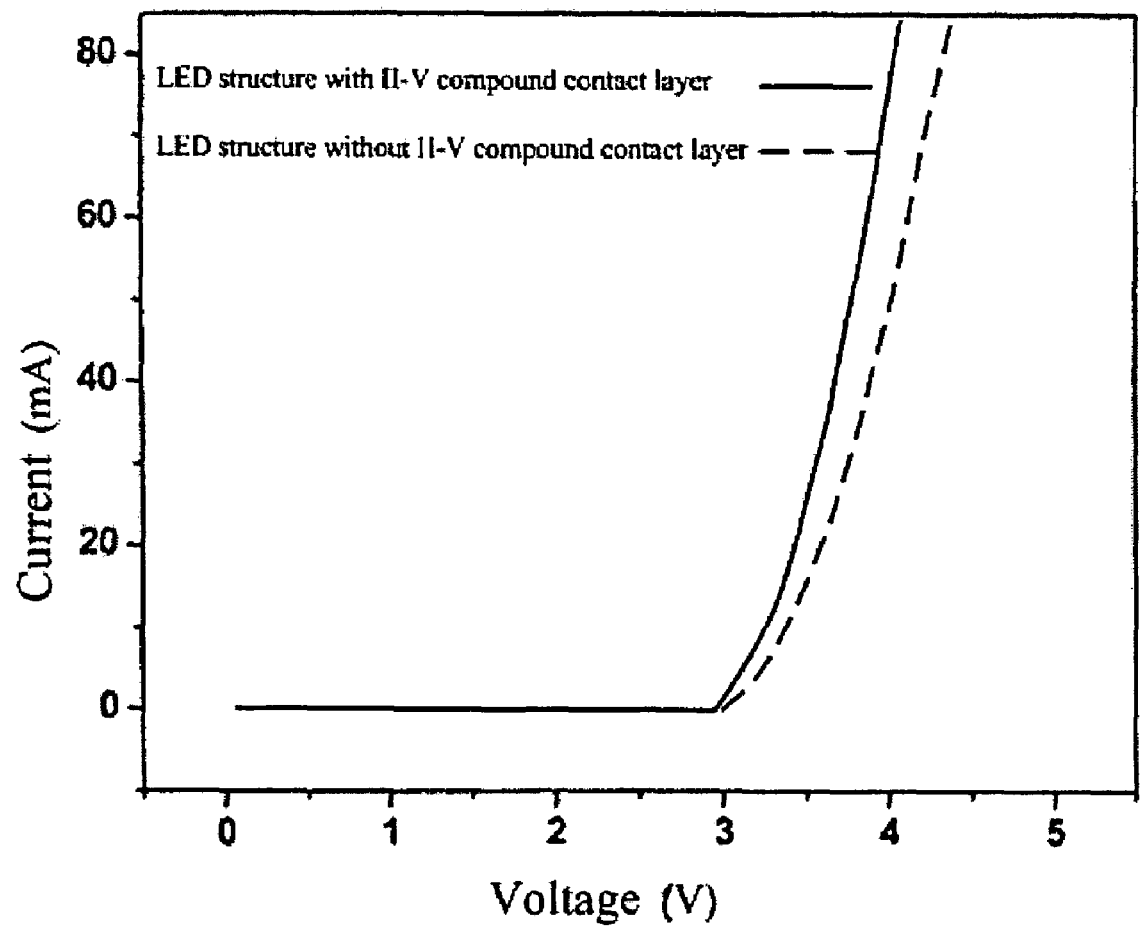
FIG. 3 is the graph of the I-V test conducted for the LEDs with and without a II-V group compound contact layer.

Referring to FIG. 3, FIG. 3 is the drawing of the I-V test conducted for the LEDs with and without a II-V group compound contact layer according to a preferred embodiment of the invention. The II-V group compound contact layer, included in the LED, is prepared by the reaction between ammonia and Mg; the II-V group compound contact layer is $Mg_3N_2$. Referring to FIG. 3, the LED with a II-V group compound contact layer has a lower resistance value than that without a II-V group compound contact layer. Moreover, from the technical viewpoint, the II-V group compound contact layer provided by the invention is certainly applicable to other semiconductor light-emitting devices not described in the specification.

Obviously, the semiconductor light-emitting device with II-V group (or II-IV-V group) compound contact layer, according to a preferred embodiment of the invention, is capable of improving the ohmic contact between the P-type GaN contact layer and the transparent conductive layer. Moreover, compared to the prior art, the semiconductor light-emitting device with II-V group (or II-IV-V group) compound contact layer has an easier manufacturing process; it also increases the stability for production and consequently has lower cost for production.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor light-emitting device, comprising:
   a substrate;
   a first conductive type semiconductor material layer, formed on the substrate;
   a light-emitting layer, formed on the first conductive type semiconductor material layer such that a partial area of the first conductive type semiconductor material layer is exposed;
   a first electrode, formed on the exposed partial area of the first conductive type semiconductor material layer;
   a second conductive type semiconductor material layer, formed on the light-emitting layer;
   a II-IV-V group compound ohmic contact layer, formed on the second conductive type semiconductor material layer, wherein the material of the II-IV-V group compound ohmic contact layer is represented by the general formula: $M_xN_yQ_z$, where M represents the II group chemical element, N represents the IV group chemical element, Q represents the V group chemical element, $1 \leq x \leq 3$, $1 \leq y \leq 3$, $1 \leq z \leq 3$, and x and y and z are molar numbers;
   a transparent conductive layer, formed on the II-IV-V group compound ohmic contact layer such that a partial area of the II-IV-V group compound ohmic contact layer is exposed; and
   a second electrode, formed on the exposed partial area of the II-IV-V group compound ohmic contact layer and contacting the transparent conductive layer.

2. The semiconductor light-emitting device of claim 1, wherein the substrate is formed of a material selected from a group consisting of Si, GaN, AlN, sapphire, spinnel, SiC, GaAs, $Al_2O_3$, $LiGaO_2$, $LiAlO_2$, and $MgAl_2O_4$.

3. The semiconductor light-emitting device of claim 1, wherein the first conductive type semiconductor material layer and the second conductive type semiconductor material layer are formed of a GaN material, respectively.

4. The semiconductor light-emitting device of claim 1, wherein the first conductive type is N-type, and the second conductive type is P-type.

5. The semiconductor light-emitting device of claim 1, wherein the light-emitting layer is formed of a material selected from a group consisting of InGaN, AlGaN, and, InGaAs.

6. The semiconductor light-emitting device of claim 1, wherein a II group chemical element in the II-IV-V group compound ohmic contact layer is one selected from the group consisting of Zn, Be, Mg, Ca, Sr, Ba, and Ra, and a IV group chemical element in the II-IV-V group compound ohmic contact layer is one selected from the group consisting of C, Si, Ge, Sn, and Pb, and a V group chemical element in the II-IV-V group compound ohmic contact layer is one selected from the group consisting of N, P, As, Sb, and Bi.

7. The semiconductor light-emitting device of claim 1, wherein the thickness of the II-IV-V group compound ohmic contact layer ranges from 0.5 Angstroms to 500 Angstroms.

8. The semiconductor light-emitting device of claim 1, wherein the II-IV-V group compound ohmic contact layer is formed at a temperature ranging from 400° C. to 1100° C.

9. The semiconductor light-emitting device of claim 1, wherein the transparent conductive layer is formed of a material selected from a group consisting of Ni/Au, ITO, CTO, TiWN, $In_2O_3$, $SnO_2$, CdO, ZnO, $CuGaO_2$, and $SrCu_2O_2$.

* * * * *